US011919083B2

(12) United States Patent
Feautrier et al.

(10) Patent No.: US 11,919,083 B2
(45) Date of Patent: Mar. 5, 2024

(54) METHOD FOR INTERCONNECTING COMPONENTS OF AN ELECTRONIC SYSTEM BY SINTERING

(71) Applicant: COMMISSARIAT A L'ENERGIE ATOMIQUE ET AUX ENERGIES ALTERNATIVES, Paris (FR)

(72) Inventors: Céline Feautrier, Grenoble (FR); Maxime Bronchy, Grenoble (FR)

(73) Assignee: COMMISSARIAT A L'ENERGIE ATOMIQUE ET AUX ENERGIES, Paris (FR)

( * ) Notice: Subject to any disclaimer, the term of this patent is extended or adjusted under 35 U.S.C. 154(b) by 65 days.

(21) Appl. No.: 17/446,770

(22) Filed: Sep. 2, 2021

(65) Prior Publication Data
US 2022/0062990 A1    Mar. 3, 2022

(30) Foreign Application Priority Data
Sep. 3, 2020    (FR) .................................... 20 08957

(51) Int. Cl.
*B22F 3/02*    (2006.01)
*B22F 3/15*    (2006.01)
(Continued)

(52) U.S. Cl.
CPC ................. *B22F 3/24* (2013.01); *B22F 3/15* (2013.01); *H01L 21/477* (2013.01); *H01L 21/4814* (2013.01); *B22F 2998/10* (2013.01)

(58) Field of Classification Search
CPC . B22F 3/15; H01L 24/28; H01L 24/29; H01L 24/30; H01L 21/477;
(Continued)

(56) References Cited

U.S. PATENT DOCUMENTS

2007/0183920 A1* 8/2007 Lu ........................... B22F 7/064
    75/252
2008/0085962 A1* 4/2008 Simone .................. H05K 3/105
    524/403
(Continued)

FOREIGN PATENT DOCUMENTS

CN    103606394 A    2/2014
CN    108847395 A    11/2018
(Continued)

OTHER PUBLICATIONS

Omar et al. ("Rapid debinding of 316L stainless steel injection moulded component." Journal of Materials Processing Technology 140.1-3 (2003): 397-400.) (Year: 2003).*
(Continued)

*Primary Examiner* — Ricardo D Morales
(74) *Attorney, Agent, or Firm* — Oblon, McClelland, Maier & Neustadt, L.L.P.

(57) ABSTRACT

A method for interconnecting components of an electronic system includes depositing a sintering solution onto a first component to form an interconnection layer, the sintering solution having metal nanoparticles dispersed in a solvent, and a stabilizing agent adsorbed onto the nanoparticles. The nanoparticles have for more than 95.0% of their mass a metal selected from silver, gold, copper and alloys thereof and have a polyhedral shape with an aspect ratio of more than 0.8. The method also includes eliminating, at least partially, solvent from the layer to form an agglomerate in which the stabilizing agent binds nanoparticles together and maintains at least a portion of the nanoparticles at a distance from each other; debinding and sintering the layer by bringing the agglomerate into contact with a destabilizing agent to aggregate and coalesce the nanoparticles and depos-
(Continued)

iting a second component in contact with the layer before or during debinding or sintering.

21 Claims, 1 Drawing Sheet

(51) Int. Cl.
    *H01L 21/477*     (2006.01)
    *H01L 21/48*     (2006.01)
    *B22F 3/24*     (2006.01)

(58) Field of Classification Search
CPC ........ H01L 21/4814; H05K 3/321; C09J 9/02; H01B 1/02; H01B 1/22
See application file for complete search history.

(56) References Cited

U.S. PATENT DOCUMENTS

| | | | |
|---|---|---|---|
| 2015/0282330 A1 | 10/2015 | Iseda et al. | |
| 2017/0077057 A1 | 3/2017 | Endoh et al. | |
| 2018/0250751 A1* | 9/2018 | Kawana | B22F 1/068 |
| 2019/0283129 A1 | 9/2019 | Endoh et al. | |
| 2019/0355690 A1 | 11/2019 | Nakako et al. | |

FOREIGN PATENT DOCUMENTS

| | | |
|---|---|---|
| EP | 3 150 301 A1 | 4/2017 |
| EP | 3 569 329 A1 | 11/2019 |
| WO | WO 2019/065221 A1 | 4/2019 |

OTHER PUBLICATIONS

French Preliminary Search Report dated Mar. 3, 2021 in French Application 2008957 filed on Sep. 3, 2020, 3 pages (with English Translation of Categories of Cited Documents).

French Preliminary Search Report dated Mar. 3, 2021 in French Application 2008955 filed on Sep. 3, 2020, 3 pages (with English Translation of Categories of Cited Documents).

Conyers Herring, "Effect of Change of Scale on Sintering Phenomena" Journal of Applied Physics, vol. 21, Apr. 1950, pp. 301-303 and cover page.

Zhen-Wen Lin, et al. "Seed-Mediated Growth of Silver Nanocubes in Aqueous Solution with Tunable Size and Their Conversion to Au Nanocages with Efficient Photothermal Property" Chemistry a European Journal, vol. 22, 2016, pp. 2326-2332.

Qiang Zhang, et al., "Production of Ag Nanocubes on a Scale of 0.1 g per Batch by Protecting the NaHS-Mediated Polyol Synthesis with Argon" ACS Appl. Mater. Interfaces, Sep. 30, 2009, vol. 1, No. 9, pp. 1-13.

* cited by examiner

[Fig 1]
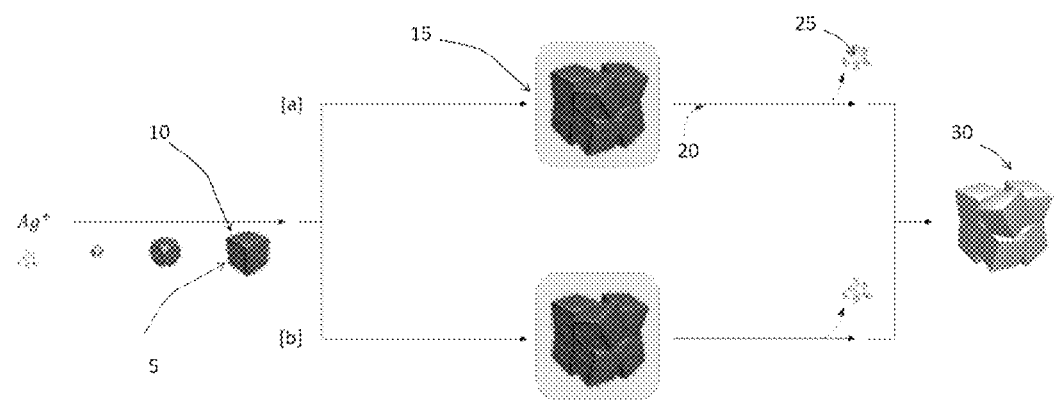
[Fig 2]
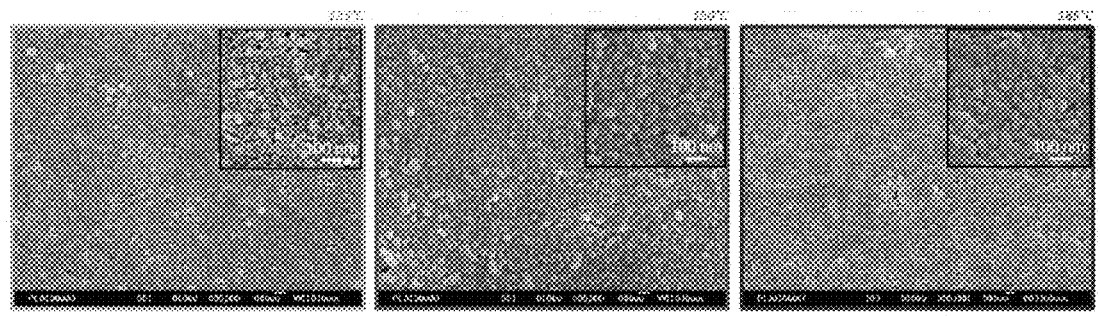
[Fig 3]
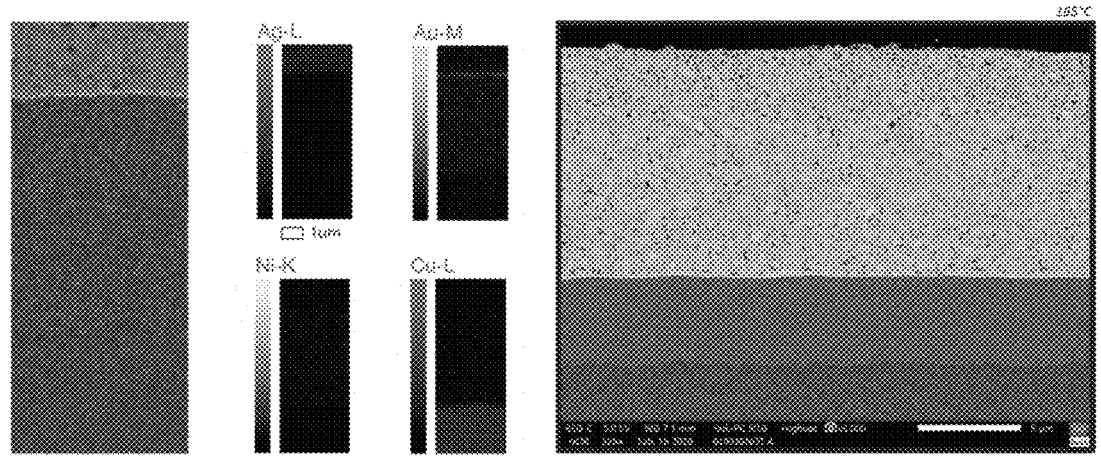

METHOD FOR INTERCONNECTING COMPONENTS OF AN ELECTRONIC SYSTEM BY SINTERING

TECHNICAL FIELD

The invention relates to a method for interconnecting components of an electronic system. In particular, it relates to the interconnection of an electronic chip, for example produced from a semiconductor material with a dielectric substrate or with another high performance electronic component.

PRIOR ART

Interconnecting the components of an electronic system is generally carried out by means of a dense metallic layer sandwiched between the components and in contact with them.

It has been known for a long time that an interconnection layer of this type can be produced by soldering, i.e. by fusion of a metal or an alloy, generally based on lead or tin that forms the interconnection layer after cooling. However, soldering alloys based on lead are generally harmful, while solders based on tin do not perform as well as lead-based solders.

Sintering a sintering paste based on silver is also a known technique for interconnecting electronic components. A sintered silver-based interconnection layer generally has better thermal properties and electrical properties than a tin solder. As an example, a sintered silver interconnection layer may have an electrical conductivity of more than $20 \times 10^6$ S·m$^{-1}$ and a thermal conductivity of the order of 200 W·m$^{-1}$·K$^{-1}$, while a soldered interconnection layer based on a Sn—Ag—Cu alloy has an electrical conductivity of $7.5 \times 10^6$ S·m$^{-1}$ and a thermal conductivity of the order of 50 W·m$^{-1}$·K$^{-1}$.

A sintering paste of this type generally comprises 90% by weight of particles of silver, a viscous solvent to limit spreading of the paste as it is being deposited and which is non-aqueous in order to limit oxidation of the silver during storage of the paste. It may also comprise additives for increasing the viscosity of the paste, as well as a stabilizing agent to prevent agglomeration of the particles. The stabilizing agent may also participate in improving the cohesion of the interconnection layer.

EP 3 150 301 A1 and US 2019/0283129 A1 each describe a bonding material and a bonding method implementing it. US 2015/0282330 A1 describes a conductive adhesive for serigraphy. EP 3 569 329 A1 describes a copper paste for pressureless bonding.

However, sintering necessitates heating to a temperature in the range 200° C. to 300° C., which proves to have deleterious effects on some electronic components which are sensitive to temperature. The sintering processes which are currently known are in particular not adapted to the interconnection of a component with a polymer substrate, a component produced from a doped semiconductor material, in which the charge carriers diffuse under the effect of temperature, or a component with a high thermal inertia, for example a radiator.

In order to reduce the sintering temperature, it is known to apply a pressure to the assembly of components to be sintered. However, applying a pressure could damage the components.

Another known means for reducing the sintering temperature is to formulate a sintering paste comprising micrometric particles and nanometric particles which are less than 100 nm in size. Nanometric particles of this type are more reactive than microparticles. They sinter between themselves at temperatures well below the fusion temperature of solid silver (961° C.). It is also well known that the time period required for sintering reduces in a non-linear manner along with a reduction in the particle size, for example in accordance with Herring's law of similarities, as described in the article by C. Herring, Journal of Applied Physics 21, 301 (1960).

It is also known, for example from WO 2019/065221 A1, to adjust the shape of nanoparticles into the form of platelets with a triangular or hexagonal base in order to increase the contact surface area of the interconnection layer with the components to be interconnected. A pressure may be applied to the components in order to favor a planar arrangement of the particles and bring the particles close to each other.

Thus, there is a need for a sintering method that is adapted to the interconnection of components of an electronic system which overcomes the disadvantages of the prior art.

DISCLOSURE OF THE INVENTION

The invention concerns a method for interconnecting components of an electronic system, the method comprising the steps of:
a) depositing a sintering solution onto a first component in order to form an interconnection layer, the sintering solution comprising a solvent, metal nanoparticles dispersed in the solvent, and a stabilizing agent adsorbed onto the metal nanoparticles,
the metal nanoparticles comprising for more than 95.0% of their mass a metal selected from silver, gold, copper and alloys thereof and having a polyhedral shape with an aspect ratio of more than 0.8,
b) eliminating, at least partially, the solvent from the interconnection layer such as to form at least one agglomerate in which the stabilizing agent binds them together and maintains at least a portion of the metal nanoparticles at a distance from each other,
c) debinding and sintering the interconnection layer by bringing the agglomerate into contact with at least one destabilizing agent configured to desorb the stabilizing agent from the metal nanoparticles in order to aggregate and coalesce said metal nanoparticles between themselves, and
d) depositing a second component in contact with the interconnection layer before or during debinding or sintering.

The interconnection layer may then readily be sintered at a temperature of 200° C. or less, and in particular at a temperature of 100° C. or more. It may furthermore be sintered without the need to apply pressure.

Components of an electronic system that are damaged under the effect of too high a temperature or too high a pressure may therefore easily be interconnected by carrying out the method in accordance with the invention.

Sintering Solution

The particles may comprise for more than 99.0%, or even more than 99.9% of their mass a metal selected from silver, gold, copper and alloys thereof.

Preferably, more than 99.0%, or even more than 99.9% of the mass of the metal nanoparticles is constituted by silver. Silver is preferred because it has an electrical conductivity and a thermal conductivity which are higher than those of gold and copper.

The metal nanoparticles have a polyhedral shape. Advantageously, the polyhedral nanoparticles have small radii of curvature at the edges between their faces. The edges and the vertices of a polyhedral nanoparticle are particularly reactive zones that may be less covered by the stabilizing agent than the faces. Coalescence of metal nanoparticles coming into contact with each other at a temperature of less than 200° C. is therefore facilitated. Because the edges and the vertices have small radii of curvature, their destabilization takes place at a lower temperature. The phenomenon known as "melting point depression" describes the reduction in the fusion temperature with the reduction in particle size. In accordance with a similar mechanism, the sintering of zones with a small radius of curvature also takes place at a lower temperature.

The polyhedral shape is preferably convex. It may be regular. It may be selected from:
 a hexahedron, preferably a cube,
 an octahedron, and
 a cuboctahedron.

The polyhedral shape may be truncated, i.e. obtained by truncation of a regular polyhedron. Truncation of a truncated polyhedron consists of removing pyramidal portions at each vertex of the polyhedron, the pyramidal portions having a maximum of only one vertex in common.

Preferably, the metal nanoparticles are cubic in shape, optionally truncated.

The metal nanoparticles form a particulate assembly.

A first fraction of the particulate assembly may be formed by metal nanoparticles having a first polyhedral shape, and a second fraction of the particulate assembly may be formed by metal nanoparticles having a second polyhedral shape which differs from the first polyhedral shape. The second fraction may be the complement of the first fraction in the particulate assembly.

Furthermore, the metal nanoparticles have an aspect ratio of more than 0.8, preferably more than 0.9, or even more than 0.95, or even more than 0.99, for example equal to 1.

The "aspect ratio" of a particle is equal to the ratio of the smallest axis to the largest axis of the smallest circumscribing ellipsoid of the particle. As an example, a particle with a cubic shape which is circumscribed by a sphere has an aspect ratio equal to 1. The "aspect ratio" can be measured from an image acquired by scanning electron microscopy.

The size of the largest nanoparticle or nanoparticles of the particulate assembly is preferably less than 500 nm.

The "size" of a particle is the radius of the smallest circumscribing sphere of the particle. It can be measured from an image acquired by scanning electron microscopy or by dynamic light scattering.

The metal nanoparticles preferably have a mean size of less than 100 nm, preferably less than 50 nm.

They may have a mean size in the range 1 nm to 30 nm, and in particular at least 5 nm.

The "mean" size of a particulate assembly is the arithmetic mean of the sizes of the particles of the particulate assembly.

The particulate assembly may be polydisperse or monodisperse in size. In the context of the invention, a particulate assembly which is monodisperse in size is such that the dispersion index as regards size, defined as the ratio of the difference between the ninetieth percentile $D_{90}$ and the tenth percentile $D_{10}$ of the size of the particles over the median size $D_{50}$ of the particles, is less than 0.2, preferably less than 0.1. In particular, a particulate assembly which is monodisperse in size may be such that the particles of which it is composed have the same size.

The stabilizing agent is adsorbed onto the metal nanoparticles. It keeps the metal nanoparticles apart and prevents them from agglomerating within the solution. It favors a homogeneous dispersion of the metal nanoparticles in the volume of the solution.

The stabilizing agent may be selected from the group formed by anionic surfactants, amphoteric surfactants, cationic surfactants, non-ionic surfactants and mixtures thereof.

The stabilizing agent may be selected from polyvinylpyrrolidone, polyacrylic acid, sodium tricitrate and mixtures thereof. Preferably, the stabilizing agent is polyvinylpyrrolidone, preferably with a molar mass comprised between 10000 g·mol$^{-1}$ and 300000 g·mol$^{-1}$, preferably equal to 10000 g·mol$^{-1}$. Polyvinylpyrrolidone is known by the acronym PVP.

The solvent is preferably organic.

The solvent may be selected from water, a polyol and mixtures thereof. In particular, the solvent may be a polyol and may be selected from 1,2-propanediol, ethylene glycol, diethylene glycol and mixtures thereof.

In one embodiment of the method, the solvent may be such that its thermal decomposition results in the formation of the destabilizing agent. Preferably, the thermal decomposition temperature of the solvent is less than 200° C. A dehydration reaction for a solvent under the effect of heating is an example of the thermal decomposition of a solvent.

Preferably, in accordance with the first preferred example in which the stabilizing agent is PVP, the solvent may be such that it forms a ketone, optionally an aldehyde, and water, for example by dehydration under an inert atmosphere. A ketone of this type, optionally mixed with water, is a destabilizing agent for PVP. A solvent which can decompose into a ketone or aldehyde may be selected from ethylene glycol, diethyleneglycol, 1,2-propanediol and mixtures thereof. Preferably, the solvent is 1,2-propanediol, the dehydration reaction of which forms acetone and water.

The sintering solution may be deposited using any known means, for example by screen printing, with a syringe, or by printing.

The volume of sintering solution deposited on the first component may be less than 1000 µL, or even less than 100 µL, for example approximately 15 µL.

The interconnection layer deposited in step a) preferably extends over a surface area of less than 20 mm$^2$.

The sintering solution may comprise, as percentages by weight expressed on the basis of the mass of the sintering solution:
 between 20.0% and 90.0% of polyhedral metal nanoparticles,
 between 0.1% and 3.0% of stabilizing agent, and
 between 7.0% and 79.9% of solvent.

The metal nanoparticles, the stabilizing agent and the solvent may represent more than 95.0%, preferably more than 99.0%, or even 100% of the mass of the sintering solution.

The sintering solution may furthermore comprise a texturing agent to increase the viscosity of the solution.

The sintering solution may comprise another particulate assembly formed by metal microparticles, the smallest of the microparticles being more than 1 µm in size. The metal microparticles are preferably formed from the same metal or alloy as the metal nanoparticles.

The shape of the metal microparticles may differ from that of the metal nanoparticles. In particular, the metal microparticles may have a platelet shape. The term "platelet shape" should be understood to mean a polyhedral shape for which the aspect ratio is less than 0.7, or even less than 0.5, or even less than 0.3. The metal microparticles increase the viscosity of the sintering solution in order to facilitate its deposition, for example by screen printing or with a syringe. Thus, because of their size, the microparticles may be used to increase the volume of the interconnection layer without degrading the thermal, mechanical and electrical properties thereby.

The sintering solution may comprise, as percentages by weight expressed on the basis of the mass of the sintering solution:
between 0.1% and 3.0% of stabilizing agent,
between 7.0% and 79.9% of solvent,
between 20.0% and 90.0% of metal nanoparticles and of metal microparticles,
the ratio of the metal microparticles content to the sum of the metal nanoparticles content and metal microparticles content being in the range 0.3 to 0.7.

The metal nanoparticles, the metal microparticles, the stabilizing agent and the solvent may represent more than 95.0%, preferably more than 99.0%, or even 100% of the mass of the sintering solution.

Partial Elimination of Solvent

In step b), the solvent is at least partially eliminated from the interconnection layer.

Preferably, elimination of the solvent is carried out at a temperature of less than 200° C.

Elimination of the solvent preferably comprises evaporation and/or decomposition, preferably thermal, of the solvent.

The solvent may be decomposed thermally, optionally before evaporation. The solvent is thus heated to a temperature that is greater than or equal to its thermal decomposition temperature, in particular its dehydration temperature. Preferably, the thermal decomposition of the solvent is carried out at a temperature that is less than or equal to 200° C., and preferably greater than or equal to 100° C. and 200° C.

The thermal decomposition, in particular dehydration, of the solvent may result in the formation of the destabilizing agent. It may furthermore be accompanied by the reaction of the destabilizing agent with the solvent and form a volatile reaction product, which facilitates the elimination of the solvent. As an example, in the variant in which the solvent is 1,2-propanediol, heating the solvent to a temperature of more than 135° C. causes the decomposition of 1,2-propanediol to water and acetone. The acetone and the water can react with the 1,2-propanediol which has not decomposed and form 2,2-trimethyldioxolane, which is in the vapor form at a temperature of more than 98° C. and can therefore easily be extracted from the interconnection layer.

Thermal decomposition of the solvent may be carried out for a period comprised between 0.5 h and 10 h.

The solvent may be heated by heating the first component, the heat flux applied to the first component being transmitted to the interconnection layer. As an example, a lower face of the first component which is opposite to the face on which the interconnection layer is placed may be heated.

The evaporation and/or thermal decomposition may be carried out under a neutral atmosphere, for example under argon, or under a reducing atmosphere, in order to prevent oxidation of the metal nanoparticles.

A portion or, as is preferable, all of the solvent contained in the interconnection layer may be eliminated.

More than 95%, or even more than 99%, or even 100% of the quantity of solvent contained in the interconnection layer may be evaporated.

During the elimination of the solvent, the concentration of metal nanoparticles and of stabilizing agent may increase within the sintering solution. It may result in an agglomeration of the metal nanoparticles between themselves. The stabilizing agent adsorbed onto the nanoparticles then acts as a binder between the nanoparticles. Furthermore, it maintains the nanoparticles apart from each other within the agglomerate which is formed thereby.

The metal nanoparticles may form one or more agglomerates.

The stabilizing agent may form a layer interposed between the metal nanoparticles and in contact with the metal nanoparticles, with a thickness which is comprised between 1 nm and 10 nm, for example.

Debinding and Sintering

Step c) comprises debinding and sintering the interconnection layer.

Debinding is carried out by bringing the agglomerate into contact with a destabilizing agent.

The destabilizing agent interacts with the stabilizing agent in order to desorb the stabilizing agent from the surface of the metal nanoparticles. The destabilizing agent can therefore be used to extract or eliminate at least a portion of the stabilizing agent from the agglomerate. The stabilizing agent is then no longer interposed between the metal nanoparticles. The metal nanoparticles therefore tend to come into contact under the effect of attractive forces and form an aggregate. Furthermore, because of their small size and their polyhedral shape, they have a high surface reactivity, in particular at the polyhedral edges and vertices, which initiates their coalescence and sintering of the aggregate.

With knowledge of the stabilizing agent, the person skilled in the art will readily and in a routine manner be able to select such a destabilizing agent.

The destabilizing agent may in particular be selected from water, a ketone, in particular acetone and/or butanone, and mixtures thereof. A preferred ketone is acetone. Preferably, the destabilizing agent is different from an alcohol.

In the variational embodiment in which the stabilizing agent is PVP, the destabilizing agent is preferably selected from acetone, water and mixtures thereof.

The destabilizing agent may, for example, be deposited onto the interconnection layer in the form of a droplet.

The destabilizing agent may result from the decomposition, preferably thermal, of the solvent. It may be formed by at least one or even more products obtained from the decomposition of the solvent and may be contained in the interconnection layer at the end of step b). Thus, the contact between the destabilizing agent and the stabilizing agent in step c) may be carried out directly by decomposing, at least partially, the solvent in step b).

The decomposition product may be formed in the vapor form during the decomposition of the solvent, then condense on the agglomerate or be taken up into solution with the solvent within the interconnection layer which has not decomposed.

The step for debinding and sintering is preferably carried out at a temperature of less than 200° C., or even less than or equal to 150° C., and preferably greater than or equal to 100° C.

It may be carried out at a temperature of 150° C. or less, for example at a temperature comprised between 100° C. and 150° C. A step of this type may therefore be carried out when at least one of the first and second components is particularly sensitive to temperature.

In accordance with one variant, the step for debinding and sintering may be carried out at a temperature of more than 100° C., and for example comprised between 120° C. and 190° C., in order to densify and reduce the porosity of the interconnection layer and to increase the mechanical strength of the assembly formed by the first and second components and by the interconnection layer.

The step for debinding and sintering may be carried out for a period comprised between 1 h and 10 h.

Furthermore, the temperature at which debinding is carried out may be lower than the temperature at which sintering is carried out. Debinding and sintering may respectively be carried out at temperatures that are respectively lower than and higher than the evaporation temperature of the destabilizing agent. Thus, during sintering, the residual destabilizing agent which has not reacted with the stabilizing agent may be evaporated in a manner such as to reduce the presence of residual organic elements in the sintered interconnection layer. As an example, in the case in which the destabilizing agent is acetone, debinding of the interconnection layer may be carried out at a temperature of less than 56° C., above which acetone is vaporized, then sintered at a temperature of more than 56° C.

The interconnection layer may be maintained at and in particular heated to the same temperature during step b) for the elimination of solvent and step c) for debinding and sintering.

In step c) and step d), sintering may be carried out without the application of any pressure, i.e. other than the weight of the second component. The term "pressure" means any force per unit surface area applied to the interconnection layer other than the weight of the first component or of the second component.

Sintering may be carried out without the application of any pressure to the interconnection layer.

In a variant, a pressure may be applied to the interconnection layer which is preferably less than 0.1 MPa.

Deposition of Second Component

The second component is deposited onto the interconnection layer during debinding or sintering. Thus, at the end of sintering, the interconnection layer adheres to the second component and hence connects the first and second components.

The thickness of the sintered interconnection layer may be comprised between 100 nm and 1000 μm.

The density of the sintered interconnection layer is preferably more than 90%, preferably greater than or equal to 95%, or even more than 99% of the density of said metal. The density of the interconnection layer is measured by metallographic analysis after slicing and polishing the sintered interconnection layer, for example by electron microscopy.

The residual organic species content represents less than 5% of the mass of the sintered interconnection layer.

The shear stress at rupture of the assembly formed by the sintered interconnection layer and the first and second components is preferably more than 10 MPa.

The electrical conductivity of the sintered interconnection layer is preferably more than $5 \times 10^6$ S·m$^{-1}$. The thermal conductivity of the interconnection layer is preferably more than $30 \times 10^6$ W·m$^{-1}$·K$^{-1}$. The coefficient of thermal expansion of the sintered interconnection layer is preferably less than $30 \times 10^{-6}$ K$^{-1}$.

The first component and/or the second component of the electronic system may be selected from a support, which in particular is flexible and/or for printing a printed circuit, a chip produced from a semiconductor material, in particular a flip chip, a light emitting diode, in particular less than 10 mm in size, preferably less than 5 mm, in particular with a size of less than 100 μm, a component of an electronic power system, for example a thermal radiator.

At least one of the first and second components may be less than 1 mm in length and/or less than 500 μm in thickness. The method in accordance with the invention can be used for low temperature sintering and is highly suitable for the interconnection of small sized components which are easy to damage under the effect of too high a temperature. In particular, the invention is highly suitable for step-by-step component interconnection.

The support may comprise a dielectric substrate produced from a polymeric material for which the fusion temperature is less than 300° C.

In particular, in accordance with one embodiment, the first component is a printing support for a printed circuit and the second component is a semiconductor material.

The printing support for a printed circuit may comprise a dielectric substrate at least partially coated with a layer of metal, in particular produced from a metal selected from silver, gold, copper and alloys thereof, preferably silver or gold. The sintering solution may be deposited on the layer of metal.

The layer of metal may be functionalized in order to reduce the surface wettability, to minimize spreading of the sintering solution over the support and to facilitate agglomeration of the nanoparticles during step b).

It may be functionalized by means of a substance selected from an aliphatic thiol, a perfluorinated thiol and mixtures thereof. Preferably, it is functionalized by means of an aliphatic thiol.

The layer of metal may be cleaned prior to depositing the sintering solution in order to remove organic pollutants that are naturally present on the surface of the layer of gold.

In accordance with another exemplary embodiment, at least one of the first and second components is a thermal radiator for an electronic power system. A radiator of this type is therefore easier to interconnect with the method in accordance with the invention, which may be carried out at a temperature of less than 200° C., than with methods of the prior art. In fact, it is difficult to heat the radiator to a temperature of more than 200° C. with known sintering methods, because the temperature ramp-up time is long due to the thermal inertia of the radiator. For this reason, with prior art methods, the radiators are generally interconnected on a support after interconnecting semiconductor chips the thermal and mechanical properties of which are frequently degraded at a lower temperature than the radiators.

Thus, the invention furthermore concerns the interconnection of a radiator for an electronic system with a first component of the electronic system by means of the method in accordance with the invention, followed by interconnection of an electronic chip with a second component of the electronic system by means of the method in accordance with the invention. The first and second components may be identical, for example a printing support for a printed circuit.

Other Optional Steps

Prior to step a), the method may comprise the preparation of the sintering solution.

The preparation of the sintering solution may comprise dissolving a salt comprising the metal forming the metal nanoparticles and the stabilizing agent in a solvent, followed by germination and growth of the nanoparticles.

The preparation of the sintering solution may furthermore comprise cleaning the metal nanoparticles and dispersion of the nanoparticles in the solvent.

Furthermore, the invention concerns a sintering solution comprising a solvent, metal nanoparticles dispersed in the solvent, and a stabilizing agent adsorbed onto the nanoparticles, the metal nanoparticles comprising for more than 95.0% of their mass a metal selected from silver, gold, copper and alloys thereof and having a polyhedral shape with an aspect ratio of more than 0.8, the sintering solution comprising, as percentages by weight:

between 20.0% and 90.0% of polyhedral metal nanoparticles,
between 0.1% and 3.0% of stabilizing agent, and
between 7.0% and 79.9% of solvent.

The sintering solution may in particular comprise one or more of the optional features described above.

The invention will now be illustrated by means of the examples below and the accompanying drawings, in which FIG. 1 schematically represents two exemplary embodiments of the method in accordance with the invention, FIG. 2 is a set of photographs from above acquired by scanning electron microscopy of an interconnection layer obtained in an exemplary embodiment of the method in accordance with the invention, and FIG. 3 is a photograph of a section of an interconnection layer accompanied by an elemental analysis map obtained by energy diffusion spectroscopy.

EXAMPLES 1 AND 2

FIG. 1 schematically illustrates different exemplary embodiments of the method in accordance with the invention.

Prior to step a), a base solution comprising cubic silver nanoparticles with a size of less than 25 nm dispersed in ethanol and stabilized by PVP with a molecular weight of 10000 g·mol$^{-1}$ was prepared from nitrate salt by growing nanocubes of silver in a polyol medium. The method described in the ACS article Appl Mater Interfaces, 2009 Sep. 30; 1(9): 2044-2048, doi:10.1021/am900400, modified as follows, was employed. A volume of 60 mL of ethylene glycol was introduced into a 250 mL capacity flask and preheated to 150° C. in air, then flushed with a stream of argon. After 10 minutes, 0.7 mL of a solution of NaSH in ethylene glycol then 15 mL of a solution of 10000 g·mol$^{-1}$ PVP in ethylene glycol in a concentration of 40 mg/mL were successively introduced into the flask. After homogenizing for 8 minutes, a volume of 5 mL of a solution of silver nitrate in ethylene glycol was introduced into the flask. The reaction medium formed thereby was maintained at 150° C. for 15 minutes with magnetic stirring and in a stream of argon. The growth reaction was then interrupted by immersing the flask in an ice bath. The dispersion of cubic nanoparticles of silver synthesized in this manner was then washed by centrifuging, the first time with acetone and several times with ethanol, in order to eliminate excess reagents and PVP from the dispersion medium, the particles then being re-dispersed in ethanol in order to facilitate their manipulation and storage. The nanoparticles with a cubic shape protected by PVP and dispersed in ethanol were then concentrated by evaporating off the ethanol under vacuum. A reduced volume of 1,2-propanediol was then added to the dispersion. The remaining ethanol was then evaporated in order to constitute a concentrated sintering solution of cubic silver nanoparticles, i.e. comprising at least 20% by weight of cubic silver nanoparticles. This sintering solution therefore comprised, as percentages by weight, 22% of cubic silver nanoparticles 5, 0.7% of PVP, 10, adsorbed onto the nanoparticles, and 77.3% of 1,2-propanediol.

A droplet with a volume of 50 μL of sintering solution was then deposited onto a dielectric substrate coated with a layer of gold with a thickness of 30 nm.

An interconnection layer comprising disordered agglomerates 15 of cubic nanoparticles connected between themselves via PVP was formed on the dielectric substrate metallized with gold.

At this stage, several exemplary embodiments of the method were produced in order to finally sinter the interconnection layer produced from silver.

Example 1 was implemented by following route (a) indicated in FIG. 1.

A droplet of 5 μL of a destabilizing agent 20, formed by 50% by volume of water and 50% acetone, was then deposited onto the interconnection layer at ambient temperature, i.e. 22° C., and under an atmosphere of argon, in order to desorb the organic stabilizing agent 25 from the nanoparticles and to evacuate the agglomerate 15.

A heat treatment was then carried out in an atmosphere of argon. The heat treatment was constituted by heating to a steady maintenance temperature, maintaining the maintenance temperature and cooling to ambient temperature.

The heating and cooling periods were fixed at 45 min and 1 h respectively for all of the heat treatments.

Three maintenance temperatures and maintenance period pairs were applied to three distinct samples: 135° C. for 16 h, 150° C. for 2 h and 185° C. for 2 h.

The heat treatment in particular enabled the 1,2-propanediol to be evaporated off, then enabled debinding and sintering of the interconnection layer. The interconnection layer was sintered when maintenance of the maintenance temperature had been completed, the silver nanoparticles having coalesced together to form a sintered aggregate 30.

In particular, an electronic chip may be deposited on the interconnection layer before or during the heat treatment in order to interconnect it with the dielectric substrate.

Example 2 was carried out by following route (b) indicated in FIG. 1.

A heat treatment was then carried out under an argon atmosphere. The heat treatment was constituted by heating to a maintenance temperature, maintaining the maintenance temperature and cooling to ambient temperature.

The heating and cooling periods were fixed at 45 min and 1 h respectively for all of the heat treatments.

Three maintenance temperature and maintenance period pairs were applied to three distinct samples: 135° C. for 16 h, 150° C. for 2 h and 185° C. for 2 h.

Under the effect of temperature, the 1,2-propanediol evaporated off then decomposed into water and acetone during the debinding step while heating for a period of 45 minutes. A PVP destabilizing agent was therefore generated by decomposition of the 1,2-propanediol which had desorbed the PVP from the silver nanoparticles. The debinding was then carried out during the heat treatment for the interconnection layer. Sintering of the interconnection layer was then carried out by coalescence of the silver nanoparticles while the maintenance temperature was being maintained, and formation of a sintered aggregate 30.

The top view photographs acquired by scanning microscopy are shown in FIG. 2 and an analysis of a section of the assembly formed by the substrate and the interconnection layer is shown in FIG. 3. As can be seen, the interconnection layers obtained in this manner have been sintered and the interconnection layer adheres perfectly to the substrate. Furthermore, no diffusion of gold into the silver layer was observed. Finally, the interconnection layer sintered at 185° C. was particularly dense and had a porosity of 5%.

After sintering, a portion of the PVP remained trapped inside the closed pores of the interconnection. The quantity of residual PVP was less than 3% of the mass of the sintered interconnection layer.

Clearly, the invention is not limited to the exemplary embodiments of the method presented above by way of illustration.

The invention claimed is:

1. A method for interconnecting components of an electronic system, the method comprising the steps of:
   a) depositing a sintering solution onto a first component in order to form an interconnection layer, the sintering solution consisting off a solvent, metal nanoparticles dispersed in the solvent, a stabilizing agent adsorbed onto the metal nanoparticles and keeping the metal nanoparticles apart,
   the metal nanoparticles comprising for more than 95.0% of their mass a metal selected from silver, gold, copper and alloys thereof and having a polyhedral shape with an aspect ratio of more than 0.8,
   b) eliminating, at least partially, the solvent from the interconnection layer such as to form at least one agglomerate in which the stabilizing agent binds them together and maintains at least a portion of the metal nanoparticles at a distance from each other,
   c) debinding and sintering the interconnection layer, at a temperature of less than 200° C., by bringing the agglomerate into contact with at least one destabilizing agent configured to desorb the stabilizing agent from the metal nanoparticles in order to aggregate and coalesce said metal nanoparticles between themselves, and
   d) depositing a second component in contact with the interconnection layer before or during debinding or sintering.

2. The method according to claim 1, the metal nanoparticles comprising for more than 99.0% of their mass a metal selected from silver, gold, copper and alloys thereof.

3. The method according to claim 1, the solvent being such that its thermal degradation results in the formation of the destabilizing agent.

4. The method according to claim 1, more than 99.0% of the mass of the metal nanoparticles being constituted by silver.

5. The method according to claim 1, the metal nanoparticles being cubic in shape, optionally truncated.

6. The method according to claim 1, the sintering solution comprising, as percentages by weight expressed on the basis of the mass of the sintering solution:
   between 20.0% and 90.0% of polyhedral metal nanoparticles,
   between 0.1% and 3.0% of stabilizing agent, and
   between 7.0% and 79.9% of solvent.

7. The method according to claim 1, the sintering solution comprising a particulate assembly formed from metal microparticles, the smallest microparticles having a size of more than 1 μm, the sintering solution comprising, as percentages by weight expressed on the basis of the mass of the sintering solution:
   between 0.1% and 3.0% of stabilizing agent,
   between 7.0% and 79.9% of solvent, and
   between 20.0% and 90.0% of metal nanoparticles and of metal microparticles,
   a ratio of the metal microparticles content to a sum of the metal nanoparticles content and metal microparticles content being in a range 0.3 to 0.7.

8. The method according to claim 1, the solvent being selected from water, a polyol and mixtures thereof.

9. The method according to claim 8, the solvent being a polyol selected from 1,2-propanediol, ethylene glycol, diethylene glycol and mixtures thereof.

10. The method according to claim 1, the stabilizing agent being selected from anionic surfactants, amphoteric surfactants, cationic surfactants, non-ionic surfactants and mixtures thereof.

11. The method according to claim 10, the stabilizing agent being selected from polyvinylpyrrolidone, polyacrylic acid, sodium tricitrate, and mixtures thereof.

12. The method according to claim 1, the destabilizing agent being selected from water, a ketone and mixtures thereof.

13. The method according to claim 1, the elimination of solvent in step b) comprising evaporation and/or decomposition of the solvent.

14. The method according to claim 1, step b) for eliminating the solvent being carried out at a temperature of less than 200° C.

15. The method according to claim 1, step c) for debinding and sintering being carried out at a temperature of less than 200° C.

16. The method according to claim 15, the sintering being carried out at a temperature of 100° C. or more.

17. The method according to claim 1, in which the first component and/or the second component of the electronic system are selected from a support, a chip produced from a semiconductor material, a light emitting diode, a component of an electronic power system.

18. The method according to claim 1, in which more than 95.0% of the mass of the metal nanoparticles is constituted by silver.

19. The method according to claim 1, in which the solvent is selected from water, 1,2-propanediol, ethylene glycol, diethylene glycol and mixtures thereof and the stabilizing agent is selected from anionic surfactants, amphoteric surfactants, cationic surfactants, non-ionic surfactants and mixtures thereof.

20. The method according to claim 1, wherein the sintering solution further consists of at least one of a texturing agent and metal microparticles.

21. The method according to claim 1, comprising debinding and sintering the interconnection layer at a temperature of less than 200° C. and greater than or equal to 100° C.

* * * * *

UNITED STATES PATENT AND TRADEMARK OFFICE
CERTIFICATE OF CORRECTION

| | |
|---|---|
| PATENT NO. | : 11,919,083 B2 |
| APPLICATION NO. | : 17/446770 |
| DATED | : March 5, 2024 |
| INVENTOR(S) | : Celine Feautrier et al. |

It is certified that error appears in the above-identified patent and that said Letters Patent is hereby corrected as shown below:

On the Title Page

Item (73) should read:
-- (73) Assignee: COMMISSARIAT A L'ENERGIE ATOMIQUE ET AUX ENERGIES ALTERNATIVES, Paris (FR) --

Signed and Sealed this
Thirtieth Day of April, 2024

Katherine Kelly Vidal
*Director of the United States Patent and Trademark Office*